(12) United States Patent
Tonietto

(10) Patent No.: US 12,314,208 B2
(45) Date of Patent: May 27, 2025

(54) SYSTEMS, APPARATUSES, METHODS, AND NON-TRANSITORY COMPUTER-READABLE STORAGE DEVICES FOR DE-SERIALIZING AND SERIALIZING DATA TRANSMISSION

(71) Applicant: Huawei Technologies Co., Ltd., Shenzhen (CN)

(72) Inventor: Davide Tonietto, Bromont (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 18/124,101

(22) Filed: Mar. 21, 2023

(65) Prior Publication Data

US 2024/0320183 A1    Sep. 26, 2024

(51) Int. Cl.
*G06F 13/42* (2006.01)
*H05K 1/18* (2006.01)

(52) U.S. Cl.
CPC ......... *G06F 13/4282* (2013.01); *H05K 1/181* (2013.01); *G06F 2213/0002* (2013.01); *H05K 2201/10378* (2013.01)

(58) Field of Classification Search
CPC ........ G06F 13/4282; G06F 2213/0002; H05K 1/181; H05K 2201/10378
See application file for complete search history.

(56) References Cited

U.S. PATENT DOCUMENTS

| | | | | |
|---|---|---|---|---|
| 8,165,133 B2* | 4/2012 | Chan | ..................... | H04L 49/352 710/63 |
| 9,692,448 B1* | 6/2017 | Kong | ..................... | H03M 9/00 |
| 2008/0067674 A1 | 3/2008 | Wang | | |
| 2008/0183904 A1* | 7/2008 | Kim | ...................... | G06F 9/445 710/6 |
| 2015/0195108 A1* | 7/2015 | Prokop | ................... | H03M 9/00 375/233 |
| 2018/0241465 A1* | 8/2018 | Scott | .................. | H04B 7/18515 |
| 2019/0058623 A1* | 2/2019 | Shulman | ............. | H04W 88/085 |
| 2020/0006164 A1* | 1/2020 | Yu | ....................... | H01L 25/0657 |
| 2024/0063841 A1* | 2/2024 | Voor | ........................ | H04B 1/44 |

FOREIGN PATENT DOCUMENTS

WO    2020112231 A1    6/2020

OTHER PUBLICATIONS

International Search Report and Written Opinion for PCT/CN2024/082470, issued by the State Intellectual Property Office of the Peoples Republic of China, Jun. 20, 2024.

* cited by examiner

*Primary Examiner* — Henry Tsai
*Assistant Examiner* — Harry Z Wang
(74) *Attorney, Agent, or Firm* — Troutman Pepper Locke, LLP; Tim Tingkang Xia, Esq.

(57) ABSTRACT

De-serializing and serializing methods are disclosed for data transmission between chips involving an arrangement of an analog frond end and a digital signal processor for the de-serializing and serializing methods. According to the present disclosure, processing in the digital domain may be carried out by a chip with smaller technology-node geometry while processing in the analog domain may be carried out by a chiplet suitable for analog components. Heat generated by the AFE is isolated from the DSP. Furthermore, costs associated with development and manufacturing may be lowered.

18 Claims, 10 Drawing Sheets

SYSTEMS, APPARATUSES, METHODS, AND NON-TRANSITORY COMPUTER-READABLE STORAGE DEVICES FOR DE-SERIALIZING AND SERIALIZING DATA TRANSMISSION

TECHNICAL FIELD

The current disclosure relates to a module, a system, and methods of de-serializing and serializing data transmission, and in particular to an arrangement of components of a serializer-de-serializer (SerDes) for data transmission.

BACKGROUND

SerDes is a technology that has been widely used in high-speed communication systems. The need for SerDes technology arose as data transfer rates increased and traditional parallel communication methods became inadequate. SerDes technology allows for the efficient transmission of data over a serial communication link by converting parallel data into a serial stream of bits that can be transmitted over a single channel, and then converting the serial data back into parallel form on the receiving end.

In recent years, the demand for SerDes technology has grown exponentially with the rise of data-intensive applications such as cloud computing, big data, and the Internet of Things. As a result, SerDes technology is now being used in a wide range of applications including high-speed networking, data centers, and consumer electronics.

While existing techniques have realized the function of serializing and de-serializing, there are compromises on efficiency, cost, performance, and/or the like, and additional, alternative, and/or improved SerDes techniques would be beneficial.

SUMMARY

In accordance with the present disclosure, there is disclosed a de-serializing method, which comprises: receiving, by a receiver of an analog front end (AFE), an analog signal in a serial stream from a signaling channel; converting, by the receiver, the received analog signal into a digital signal; processing, by a digital signal processor (DSP) connected to the AFE through a parallel digital interface, the converted digital signal from the receiver of the AFE; and delivering, by the DSP, the processed digital signal to a digital-core integrated circuit (IC), wherein the DSP and the digital-core IC are embedded in a digital-core die and the AFE is embedded in a chiplet that is separated from the digital-core die, and wherein the de-serializing method is carried out in the AFE and the DSP successively.

In one embodiment of the de-serializing method, the digital-core die may be manufactured in a process with a technology-node geometry smaller than the technology-node geometry for the chiplet.

In a further embodiment of the de-serializing method, the AFE and the DSP may form a SerDes.

In accordance with the present disclosure, there is disclosed a serializing method, which comprises: receiving, by a DSP, a digital signal from a digital-core IC; processing, by the DSP, the received digital signal; converting, by a transmitter of an AFE connected to the DSP through a parallel digital interface, the processed digital signal into an analog signal; and transmitting, by the transmitter, the converted analog signal in a serial stream to a signaling channel, wherein the DSP and the digital-core IC are embedded in a digital-core die and the AFE is embedded in a chiplet that is separated from the digital-core die, and wherein the serializing method is carried out in the DSP and the AFE successively.

In one embodiment of the serializing method, the digital-core die may be manufactured in a process with a technology-node geometry smaller than the technology-node geometry for the chiplet.

In a further embodiment of the serializing method, the AFE and the DSP may form a SerDes.

In accordance with the present disclosure, there is disclosed a module comprising an AFE and a DSP. The AFE comprises a receiver, for receiving an input analog signal in a serial stream from a signaling channel and converting the input analog signal into an input digital signal, and a transmitter for converting an output digital signal into an output analog signal and transmitting the output analog signal in a serial stream to the signaling channel. The DSP is connected to the AFE through a parallel digital interface for processing the input digital signal from the receiver of the AFE and delivering the processed input digital signal to a digital-core IC or for processing the output digital signal from the digital-core IC and delivering the processed output digital signal to the transmitter of the AFE. The DSP and the digital-core IC are embedded in a digital-core die and the AFE is embedded in a chiplet that is separated from the digital-core die.

In one embodiment of the module, the digital-core die may be manufactured in a process with a technology-node geometry smaller than the technology-node geometry for the chiplet.

In a further embodiment of the module, the module may be a SerDes.

In accordance with the present disclosure, there is disclosed a system comprising a plurality of chiplets; a digital-core die that is separated from the plurality of chiplets; and a plurality of modules. Each of the plurality of modules comprises an AFE and a DSP. The AFE comprises a receiver, for receiving an input analog signal in a serial stream from a signaling channel and converting the input analog signal into an input digital signal, and a transmitter for converting an output digital signal into an output analog signal and transmitting the output analog signal in a serial stream to the signaling channel, the AFE being embedded in one of the plurality of chiplets. The DSP is connected to the AFE through a parallel digital interface for processing the input digital signal from the receiver of the AFE and delivering the processed input digital signal to a digital-core IC or for processing the output digital signal from the digital-core IC and delivering the processed output digital signal to the transmitter of the AFE, the DSP and the digital-core IC being embedded in the digital-core die.

In one embodiment of the system, the digital-core die may be manufactured in a process with a technology-node geometry smaller than the technology-node geometry for the chiplet.

In a further embodiment of the system, each of the plurality of chiplets may comprise a plurality of AFEs.

In a further embodiment of the system, each of the plurality of modules may be a SerDes and the digital-core IC is a digital processing unit including one of application specific integrated circuit (ASIC), field programmable gate array (FPGA), central processing unit (CPU), network processing unit (NPU), graphic processing unit (GPU), tensor processing unit (TPU), or switch fabric unit (SFU).

In a further embodiment of the system, the digital-core die and the plurality of chiplets may be stacked with each other.

In a further embodiment of the system, for each of the plurality of modules, the DSP in the digital-core die may be aligned with the AFE in one of the plurality chiplets, and for each of the plurality of modules, the parallel digital interface between the DSP and the AFE may be in a form of through silicon vias (TSVs), bonded metallization, or a combination thereof.

In a further embodiment of the system, the system may further comprise a second die, the plurality of chiplets being arranged to surround the second die, and the digital-core die may be stacked atop both the second die and the plurality of chiplets.

In a further embodiment of the system, the plurality of chiplets may be arranged in a form of matrix, and the digital-core die may be stacked atop the plurality of chiplets.

In a further embodiment of the system, the system may further comprise a printed circuit board (PCB) and an interposer on the PCB, the interposer enabling the serial stream to be routed from the AFE to the signaling channel or from the signaling channel to the AFE through the PCB.

In a further embodiment of the system, the plurality of chiplets may be arranged to surround the digital-core die.

In a further embodiment of the system, the system may further comprise a PCB and an interposer on the PCB, the interposer enabling the parallel digital interface to be routed between the AFE in the at least one of the plurality of chiplets and a corresponding DSP in the digital-core die.

Embodiments according to the present disclosure allow an improved arrangement of the AFE and the DSP so that processing in the digital domain may be carried out by a chip with small technology-node geometry while processing in the analog domain may be carried out by a chiplet suitable for analog components. Heat generated by the AFE is isolated from the DSP. Furthermore, costs associated with development and manufacturing may be lowered.

BRIEF DESCRIPTION OF THE DRAWINGS

Further features and advantages of the present disclosure will become apparent from the following detailed description, taken in combination with the appended drawings, in which.

DETAILED DESCRIPTION

Figure 1:
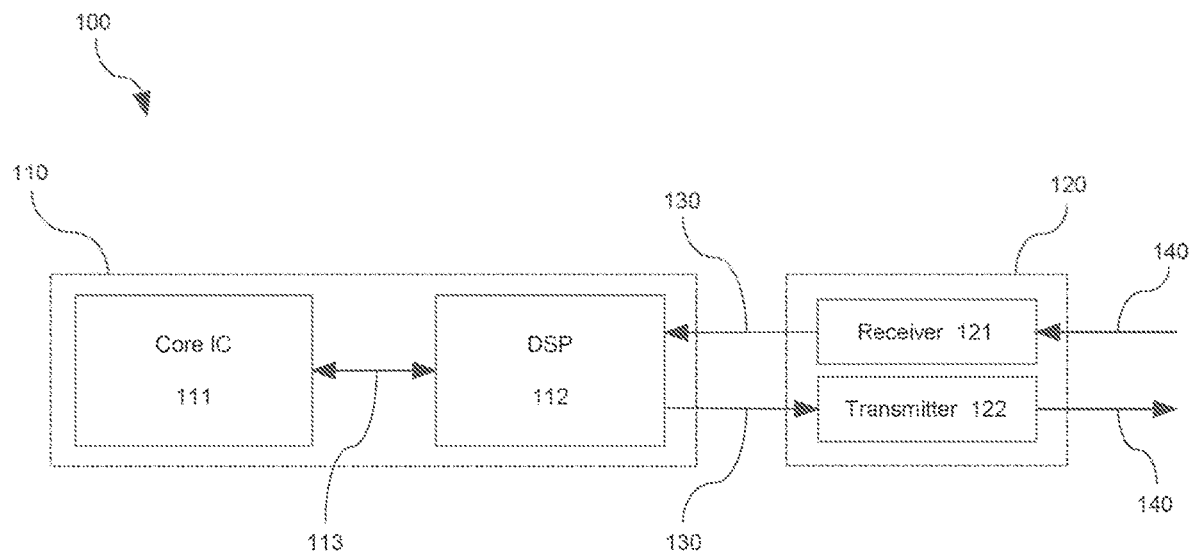
FIG. 1 is a block diagram depicting an arrangement of a core IC and a chiplet for serialization and de-serialization processes according to an embodiment of the present disclosure.

A serializer-de-serializer (SerDes) is a type of integrated circuit (IC) that is used to convert parallel data into serial data, and vice versa. The term "SerDes" is often used to refer to both the transmitter (serializer) and receiver (deserializer) functions together as a single IC. Of course, the serializer and deserializer may be implemented as separate circuits (such as separate ICs).

A SerDes typically includes a parallel input and a serial output on the transmitter or serializer side, and a serial input and a parallel output on the receiver or deserializer side. The parallel data is converted into a serial stream of bits by the transmitter, which is then transmitted over a signaling channel, such as a conductor (for example a copper cable) or an optical fiber, or any other physical media that transmits electrical signals. The receiver receives the serial stream of bits and converts it back into parallel data.

SerDes may be used in a wide range of applications, including high-speed data communication, such as in Ethernet, SONET/SDH, and PCI Express, and in video and imaging systems, such as HDMI, DisplayPort, and Camera Link.

An analog front end (AFE) is a section of a SerDes that performs the analog signal processing functions. It is responsible for conditioning the input/output signals and for ensuring that the input and output signals are at the correct voltage levels and that the signal integrity is maintained over the signaling channel. The specific components of an AFE may vary depending on the design of the SerDes, but generally it may include a transmitter block, a receiver block, a power supply block, and an on-chip termination block.

The transmitter block is responsible for converting the parallel input data into a serial output signal. It may include a voltage-controlled oscillator (VCO) and a phase-locked loop (PLL) for generating the serial clock signal, a digital-to-analog converter (DAC) for converting digital signals to analog signals, and a parallel-to-serial converter (P/S) for converting the parallel input data into a serial stream of bits.

The receiver block is responsible for converting the serial input signal into parallel output data. It may include a clock and data recovery circuit (CDR) for extracting the clock signal from the input data stream, an analog-to-digital converter (ADC) for converting analog signals to digital signals, a serial-to-parallel converter (S/P) for converting the serial input data into parallel output data, and an equalizer circuit.

The power supply block is responsible for providing the necessary voltage levels for the AFE and the rest of the SerDes. The on-chip termination block is responsible for matching the impedance of the SerDes with the external transmission line to minimize reflections and signal loss.

A digital signal processor (DSP) in a SerDes is a specialized microcontroller or microprocessor that is designed to perform digital signal processing tasks. In a SerDes system, the DSP is responsible for controlling and monitoring the operation of the SerDes. It may perform tasks such as clock and data recovery, signal equalization, and error correction. The DSP may also be used to monitor the performance of the communication link and adjust the SerDes's parameters to optimize the link's performance. Additionally, it may help to detect and correct errors in the data being transmitted, by using techniques such as forward error correction (FEC) or interleaving.

In the present disclosure, a chip or a chiplet refers to a physically separated die that may comprise one or more ICs for achieving one or more functions. A chip is a single piece of semiconductor material on which one or more integrated circuits have been formed. It contains transistors, diodes, and other components needed to perform a specific function or a set of functions. A chiplet, on the other hand, is a small piece of semiconductor material that contains a specific set of transistors, diodes, and other components. Chiplets are designed to be combined with other chiplets to form a larger, more complex IC. A chip, which is much larger than a chiplet, may implement a lot of (or very powerful) functions and thus more expensive, which make it difficult in terms of flexibility and scalability. A chiplet is small and usually only implements a small number of (or simple/less powerful/limited) functions, so chiplets are cheap and can be easily combined with better flexibility and scalability.

Chiplet-based design allows for more flexibility and scalability compared to traditional monolithic ICs, as it allows for the integration of different chiplets with different functionalities and/or technologies on a single package or substrate, this may lead to a more efficient use of resources and lower costs. Chiplets may be used to improve the performance and power efficiency of a system by allowing different parts of the system to be optimized for different performance and power characteristics. Chiplets are also more adaptable to different manufacturing processes and may be used to improve the yield of a fabrication process.

A SerDes may be implemented as a chiplet to perform serialization and deserialization processes. Chiplets are designed to be combined with other chiplets to form a larger, more complex IC. This approach allows for more flexibility and scalability compared to traditional monolithic ICs, and may lead to a more efficient use of resources and lower costs.

A SerDes may also be embedded into a larger IC that contains other functional blocks such as a microcontroller, memory, or other digital logic. This approach allows for the integration of multiple functional blocks on a single chip. This type of integration is commonly used in SoC designs, where multiple functional blocks are integrated on a single chip.

In the semiconductor industry, technology node or technology-node geometry refers to the size of the smallest feature that may be manufactured on a chip or chiplet using a particular manufacturing process. As technology advances, the size of features such as electronic components decreases, resulting in more transistors on a chip, which in turn leads to increased performance and decreased power consumption. The geometry of a technology node is typically measured in nanometers (nm).

Technology node and Moore's law are closely related, as the regular "node shrinks" in technology node are a key driver of the increase in transistors on a chip and the corresponding increase in computing power. As the feature size of a technology node decreases, it becomes possible to fit more transistors on a chip. This results in increased performance and decreased power consumption. In recent years, feature sizes have continued to shrink, with the current state-of-the-art technology node being below five (5) nm.

SerDes may be implemented as chiplets that are in turn connected to another more powerful IC in a core die, such as central processing unit (CPU), application specific integrated circuit (ASIC), field programmable gate array (FPGA), network processing unit (NPU), graphic processing unit (GPU), tensor processing unit (TPU), switch fabric unit (SFU), or any other digital processing units, for digital computation or processing. Such an arrangement mainly has two disadvantages. First, when extensive processing is required by the DSP of the SerDes, the chiplets implementing SerDes require additional, smaller SerDeses, or host SerDeses, on both the chiplets and the core die. These host SerDeses are typically free of DSPs and are only responsible for transmitting data signals between the chiplets and the core die. This is to enable the data transmission requiring high bandwidth with limited number of physical connections between the chiplets and the core die. However, the additional use of host SerDes result in a waste of area in chiplets and the core die, compromised performance of the IC in the core die, and higher costs in manufacturing. Second, chiplets are typically in a larger technology-node geometry compared with the core die, so the performance of the DSP in a SerDes is limited.

Alternatively, SerDes may be embedded into the core die. However, such an arrangement also has disadvantages. First, a significant area in the core die may be occupied by the SerDes, which affects the performance of another circuit in the core die such as CPU, ASIC, or FPGA. Second, the AFE portion of the SerDes typically generates more heat, and the temperature on the core die may be higher compared with the arrangement where SerDes are implemented as chiplets that are physically separated from the core die. In addition, the design of the analog portion of a SerDes requires extensive trial and error, and the arrangement of SerDes in the core die having advanced technology node makes the development costly. Moreover, the analog portion of the SerDes is typically not suitable to be embedded into a chip designed for digital processing.

FIG. 1 depicts an arrangement of a core IC and a chiplet for serialization and de-serialization processes according to an embodiment of the present disclosure. A system 100 is a standalone electronic component according to an embodiment of the present disclosure, which is usually encapsulated in a package such as in the form of IC chips. Typically, such an electronic component is capable of being electrically connected to other electronic components so as to exchange data and thereby be capable of performing complex operations. For example, the system 100 may be functionally an ASIC module that is capable of being connected to other modules so as to form a powerful computing or processing assembly.

In this embodiment, the system 100 comprises a digital-core die 110 and a chiplet 120 that is connected to the digital-core die 110. Such a connection allows for digital data transmission between the digital-core die 110 and the chiplet 120. A "die" refers to a single piece of semiconductor material, such as silicon, on which an integrated circuit is fabricated. The process of IC fabrication involves depositing various layers of materials and patterns onto a flat piece of semiconductor material (the die), which is then cut into individual pieces, each containing at least one complete IC. For example, the digital-core die 110 in this embodiment may constitute a monolithic IC. Therefore, the technology-node geometry is constant on the same digital-core die, and smaller technology-node geometries, such as five (5) nm, four (4) nm, three (3) nm or smaller, are usually performing well for digital purposes due to higher density and lower energy consumption, for example. On the other hand, the chiplet 120 is an individual component physically separated from the digital-core die 110, so it allows the use of older technologies for the components embedded in the chiplet 120.

The digital-core die 110 includes a core IC 111 and a DSP 112 connected to the core IC 111. In this example, the core IC 111 is for digital processing and may be in the form of an ASIC or FPGA. The DSP 112 is embedded in the same digital-core die 110 with the core IC 111 for digitally processing the signal received from the chiplet 120. The chiplet 120 includes a receiver 121 and a transmitter 122. In this embodiment, the combination of the DSP 112 (embedded in the digital-core die 110) with the receiver 121 and the transmitter 122 (embedded in the chiplet 120) acts as a SerDes. The DSP 112 acts as a DSP of the SerDes, while the receiver 121 and the transmitter 122 act as an AFE of the SerDes.

When a signal is received for the core IC 111 to process, the receiver 121 firstly receives an analog signal in a serial stream from an external chip (not shown) through a signaling channel 140. After necessary processing, such as the analog-to-digital conversion occurred in the chiplet 120, a digital signal is output to the DSP 112 through a parallel digital interface 130, so the DSP 112 may perform tasks such as clock and data recovery, signal equalization, and error correction to the digital signal. After the DSP 112 performs these tasks, a processed digital signal is delivered to the core IC 111 through an internal connection 113.

When a signal processed by the core IC 111 is to be transmitted to an external chip (not shown), the DSP 112 receives a digital signal from the core IC 111 through the internal connection 113, and then carries out tasks such as pre-distorting the digital signal to compensate for possible loss during analog transmission. Afterwards, the digital signal is output to the transmitter 122 embedded in the chiplet 120 through the parallel digital interface 130. The transmitter 122 carries out necessary processing such as digital-to-analog conversion, before the converted signal is eventually output through the signaling channel 140 in a serial stream.

In this embodiment, the receiver 121 and the DSP 112 form a receiving path of the SerDes, and the DSP 112 and the transmitter 122 form a transmitting path of the SerDes. The DSP 112 is physically located separately from the receiver 121 and the transmitter 122, and thus it may be embedded in the same chip with the core IC 111, utilizing the smaller technology-node geometry for digital processing. As such, the DSP 112 takes advantage of a more advanced chip in that the processing speed is faster and the generated heat is lower, as compared with the situation where a DSP and an AFE are both embedded in a same chiplet. The AFE being independently embedded in a chiplet is advantageous as well, because the analog circuit design usually requires higher current, resulting in higher temperature in the chiplet. The arrangement of separating the AFE away from the DSP may minimize heat radiation toward the digital-core die 110. In addition, the design of AFE requires extensive trial and error, so the chiplet only containing the analog portion of the SerDes is advantageous in that the design costs may be significantly lowered. Furthermore, the chiplet may utilize a larger technology-node geometry, which is substantially cheaper compared with smaller technology-node geometry used for the manufacturing of digital circuits. All of the above results make the embodiment of the present disclosure advantageous compared with the conventional approach where the analog portion (that is, the AFE) and the digital portion (that is, the DSP) of a SerDes are embedded in a single chip/chiplet.

Figure 2:
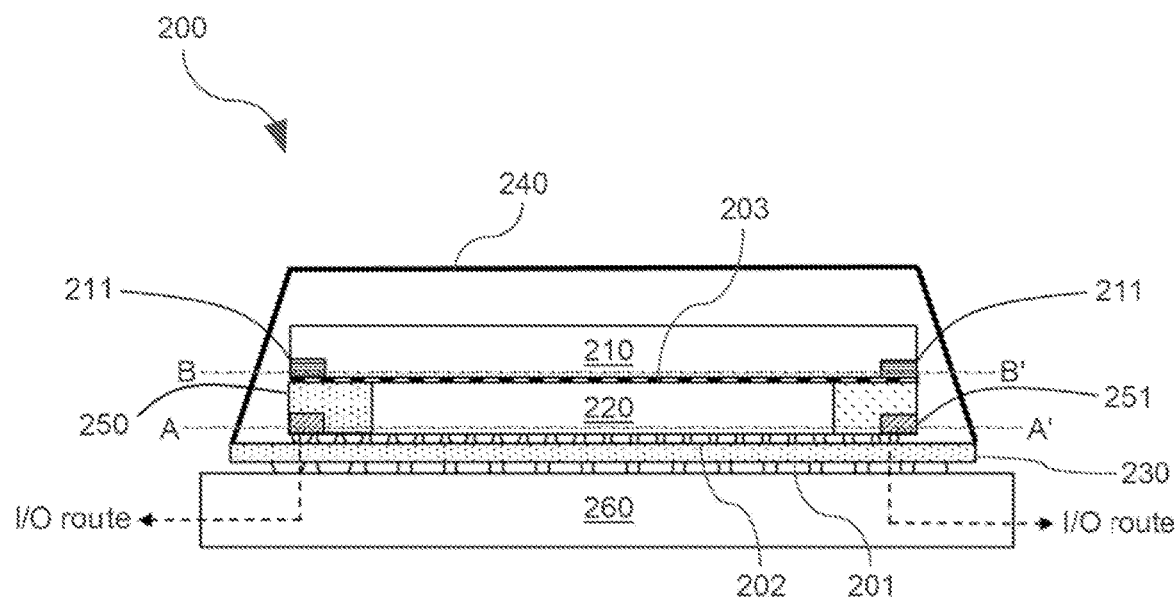
FIG. 2 is a side cross-section view of an assembly depicting an arrangement of AFEs and DSPs of SerDes according to an embodiment of the present disclosure.
Figure 3:
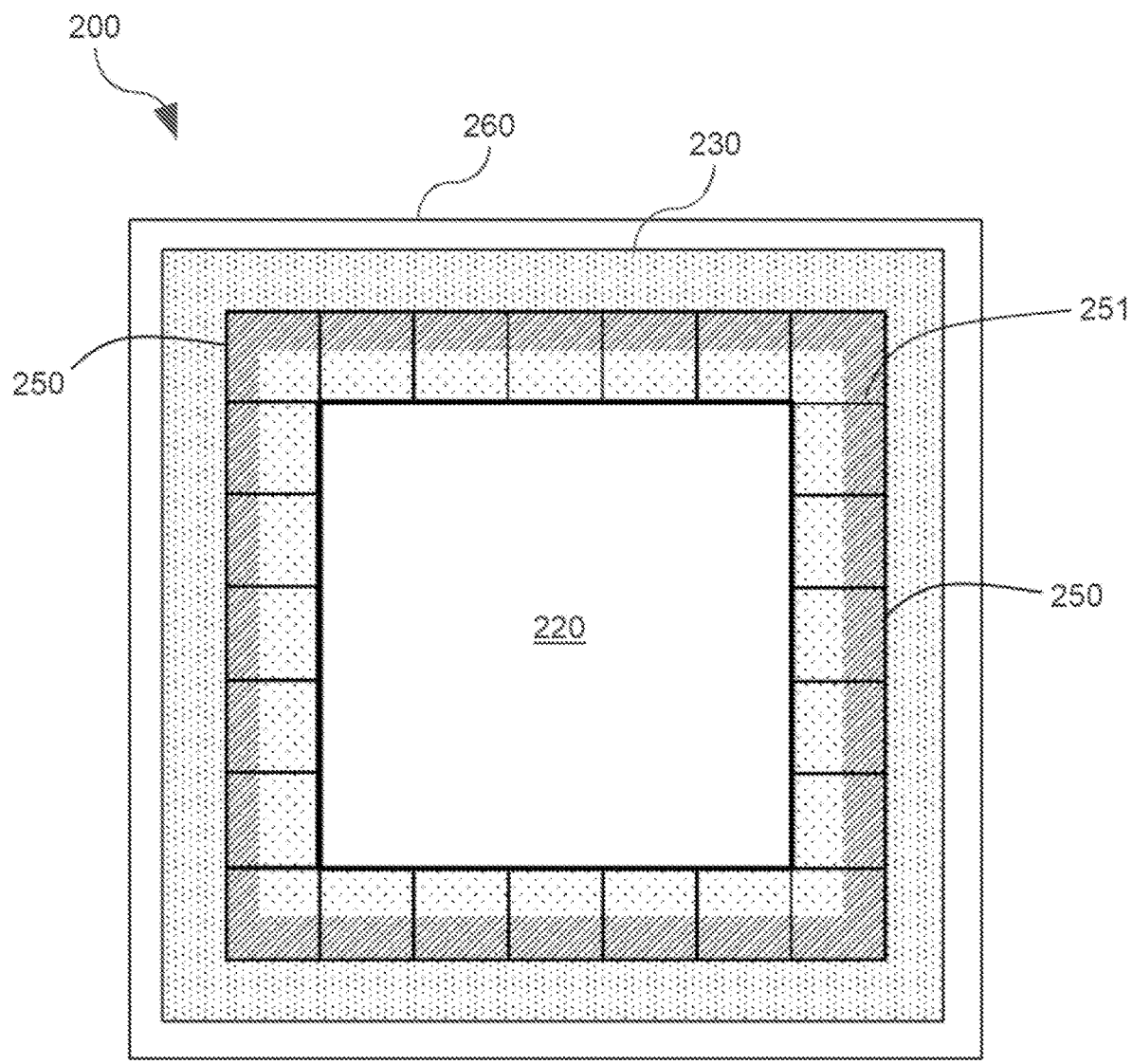
FIG. 3 is a top cross-section view of the assembly, as seen from the level indicated by the dot dash line A-A' in FIG. 2, depicting a bottom layer according to an embodiment of the present disclosure.
Figure 4:
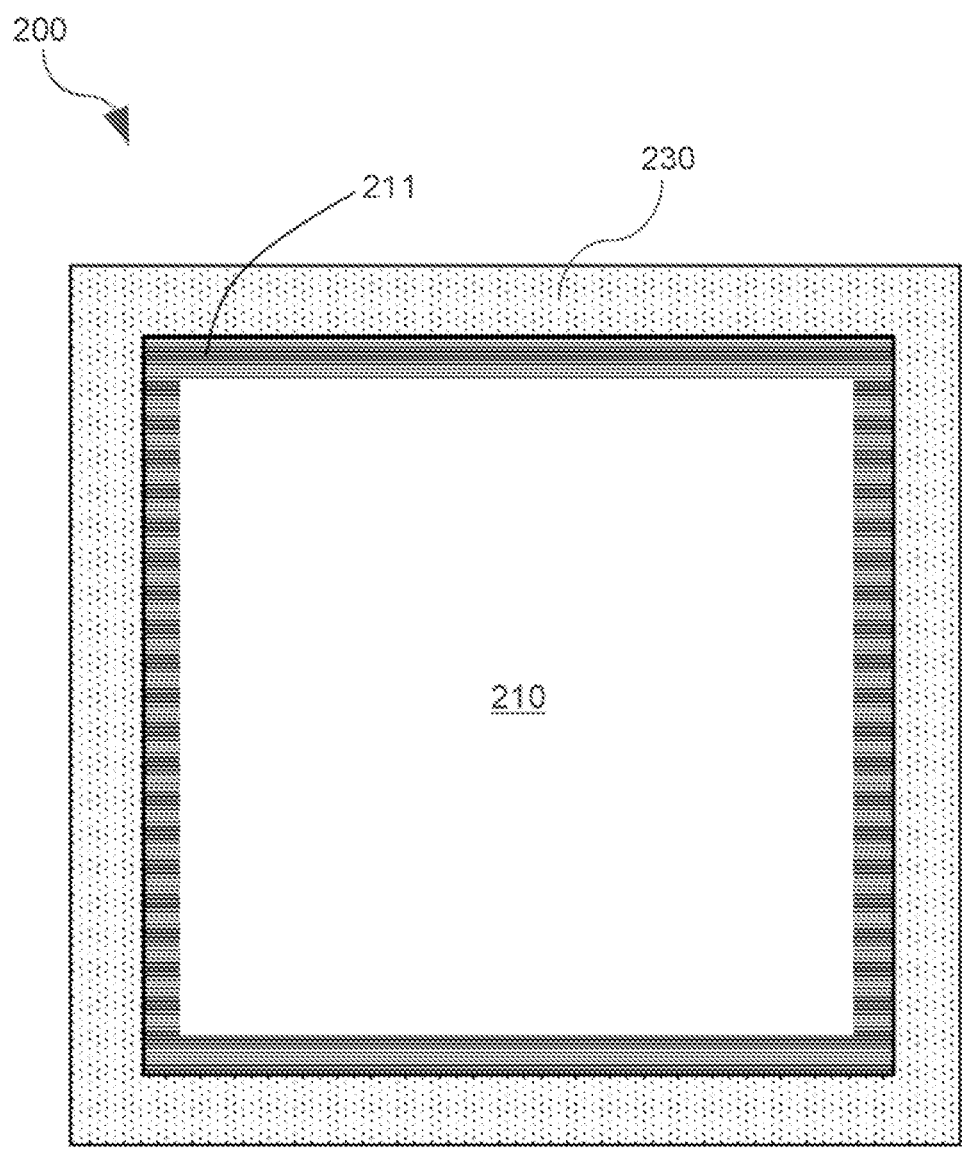
FIG. 4 is a top cross-section view of the assembly, as seen from the level indicated by the dot dash line B-B' in FIG. 2, depicting a top layer according to an embodiment of the present disclosure.

FIG. 2 is a side cross-section view of an assembly depicting an arrangement of AFEs and DSPs of SerDes according to an embodiment of the present disclosure. FIG. 3 is a top cross-section view of the assembly, as seen from the level indicated by the dot dash line A-A' in FIG. 2, depicting a bottom layer in this embodiment. FIG. 4 is a top cross-section view of the assembly, as seen from the level indicated by the dot dash line B-B' in FIG. 2, depicting a top layer in this embodiment. In the following, FIGS. 2 to 4 are described together to explain the working principle and inventive concept of this embodiment.

As shown in FIG. 2, three-dimensional (3D) stacking is involved for an assembly 200 according to an embodiment of the present disclosure. 3D stacking is a technique used to stack two or more layers of ICs vertically, increasing the amount of available space. By stacking multiple layers, chip designers may achieve higher performance and integration density than is possible with traditional two-dimensional (2D) architectures. This technology also helps to reduce the size of the chip and lower power consumption by enabling shorter interconnects between the different layers.

In this embodiment, the top layer having a first digital-core die 210 is stacked atop the bottom layer having a second die 220 and a plurality of chiplets 250 surrounding the second die 220, as shown in FIG. 3. The first digital-core die 210 may be a single chip with a core IC (not shown) and a plurality of DSPs 211 embedded therein. The core IC is connected to the plurality of DSPs 211 through internal connections (not shown) for digitally processing signals received the DSPs 211. The second die 220 may be a single chip with another IC (not shown) embedded therein for another operation. Each of the chiplets 250 comprises at least one AFE 251 embedded therein. The at least one AFE 251 in one of the chiplets 250 may be aligned with the corresponding one of DSP 211 embedded in the first digital-core die 210, as shown in FIGS. 2 to 4, to enable a short path between one of the AFEs 251 and the corresponding DSP 211.

A parallel digital interface 203 between the top layer of the first digital-core die 210 and the bottom layer of the second die 220 and the plurality of chiplets 250 may be in various suitable forms such as through-silicon vias (TSVs), interposers, and/or bonded metallization, for high-bandwidth digital data transmission. The required bandwidth depends on applications. For example, in high-speed optical communications, the data rate may range from several Gbps to 100 Gbps or higher, requiring a corresponding bandwidth. TSVs are cylindrical holes drilled through silicon wafers to connect different layers in a stack. Interposers are thin layers of insulating material that are placed between different layers of a stack. They contain metal lines that serve as electrical interconnects between the layers and are filled with a metal conductor to make electrical connections between the layers. The bonded metallization may be realized by microbumps. Microbumps are small bumps made of metal such as copper, formed on the surface of each layer and serving as interconnects between the layers. It will be appreciated that, although the parallel digital interface 203 in the example shown in FIG. 2 is in the form of microbumps, other forms of connections are readily available. TSVs may also be used in this example to electrically connect the bottom of the first digital-core die 210 to the AFEs 251 that are at the bottom of the chiplets 250.

The stack including the first digital-core die 210, the second die 220, and the plurality of chiplets 250 are fixed on a substrate 230. The substrate 230 may be an organic or inorganic substrate that assists in routing signals into or out of the stack. A chip or silicon die may be connected to a substrate in various ways. For example, wire bonding may be used, which involves attaching metal wires to the bonding pads on the silicon die and to the substrate using a process known as ball bonding or wedge bonding. Alternatively, flip-chip bonding may be used, which involves directly connecting the bonding pads on the silicon die to the substrate using a layer of metal bumps. In this embodiment, secondary interconnects 202 are between the bottom of the plurality of chiplets 250 and the top of the substrate 230 in the form of flip-chip bonding, but it should be known that other forms of connections are readily available.

The stack and the substrate 230 are encapsulated into a package 240 as a standalone electronic device that may be further connected to a printed circuit board (PCB) 260 by a bonding method such as flip-chip bonding or surface-mount technology (SMT), which refers to the way that the package is placed on the surface of the PCB and soldered directly to the pads on the PCB. In this embodiment, primary interconnects 201 are between the bottom of the substrate 230 and the top of the PCB 260 in the form of flip-chip bonding, but it should be known that other forms of connections are readily available. With the package mounted onto the PCB 260, routes are formed from the AFEs 251 in the chiplets 250 to a signaling channel (not shown) through the primary interconnects 201, the secondary interconnects 202, and traces (not shown) within the substrate 230 and the PCB 260. The input/output (I/O) route is schematically denoted by dash lines in FIG. 2.

In case that the assembly 200 is used for a de-serialization process, it receives an input analog signal in a serial stream at a receiver of the AFE 251 from the signaling channel and converts the received analog signal into a digital signal by the receiver of the AFE 251. The de-serialization process takes place successively in one or more of the AFEs 251 and one or more of the DSPs 211. The analog-to-digital conversion may be done by an internal ADC module in the AFE 251, so the output of the AFE 251 for an input signal is in the digital domain. After the signal is transmitted to the DSPs 211 (embedded in the first digital-core die 210) through the parallel digital interface 203, the DSPs 211 process the signal by finishing tasks such as clock and data recovery, signal equalization, error correction, and/or the like. Then, the processed digital signal is delivered to the core IC in the same first digital-core die 210 through internal connections.

In case that the assembly 200 is used for a serialization process, it receives an output digital signal from the core IC in the same first digital-core die 210 and process the received signal such as to pre-distort the signal to compensate for potential loss during data transmission in the analog domain. The serialization process takes place successively in one or more of the DSPs 211 and one or more of the AFEs 251. After the signal is transmitted to the AFEs 251 (embedded in the chiplets 250) through the parallel digital interface 203, the DAC in the AFE 251 converts the processed digital signal into analog signal. Then, the converted analog signal is transmitted in a serial stream to the signaling channel and eventually to an external electronic device that is either locally or remotely located in relation to the assembly 200.

In this embodiment, the AFEs 251 in the chiplets 250 and the DSPs 211 in the first digital-core die 210 are physically separated and are connected through the parallel digital interface 203. The first digital-core die 210 may typically be manufactured in a process with a technology-node geometry smaller than the technology-node geometry for the chiplets 250. Typically, the technology-node geometry for the first digital-core die 210 may be 5 nm, 4 nm, 3 nm, or smaller, while the technology-node geometry for the chiplets may be 7 nm, 8 nm, or greater. This approach may avoid the AFEs and the DSPs being embedded within a same chip or chiplet and thus realize an advantageous arrangement of the AFE and DSP for a SerDes. As a result, the analog domain and the digital domain for a single SerDes are separated, with the AFE taking advantage of an older, cheaper, less dense, yet more suitable technology for an analog domain and the DSP taking advantage of a more advanced technology for digital processing. In addition, heat generated by the AFE that typically deteriorates the performance of the DSP is substantially isolated by the physical separation.

It will be appreciated that, although FIG. 2 shows that the first digital-core die 210 is above the second die 220 and the plurality of chiplets 250, the first digital-core die may be placed beneath the second die 220 and the plurality of chiplets 250 in some other embodiments. There may be additional layer(s) in the stack for additional function(s). Furthermore, although it is shown in FIGS. 2 to 4 that the AFEs 251 and the DSPs 211 are placed in the outer circumference in their respective layers, the AFEs 251 and the DSPs 211 may be placed in different positions.

Figure 5:
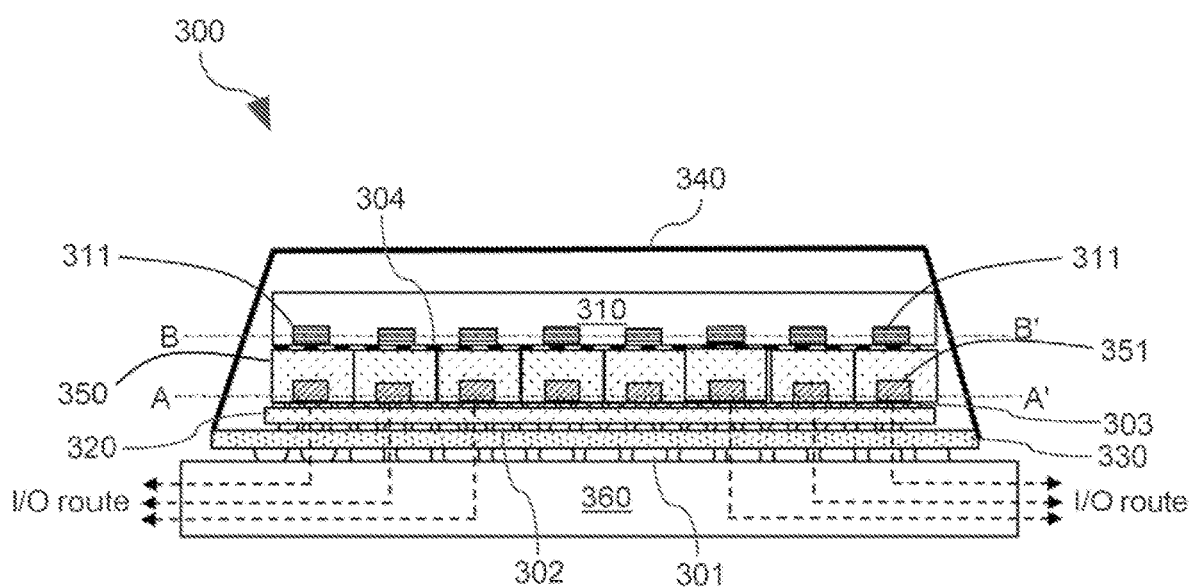
FIG. 5 is a side cross-section view of an assembly depicting an arrangement of AFEs and DSPs of SerDes according to an embodiment of the present disclosure.
Figure 6:
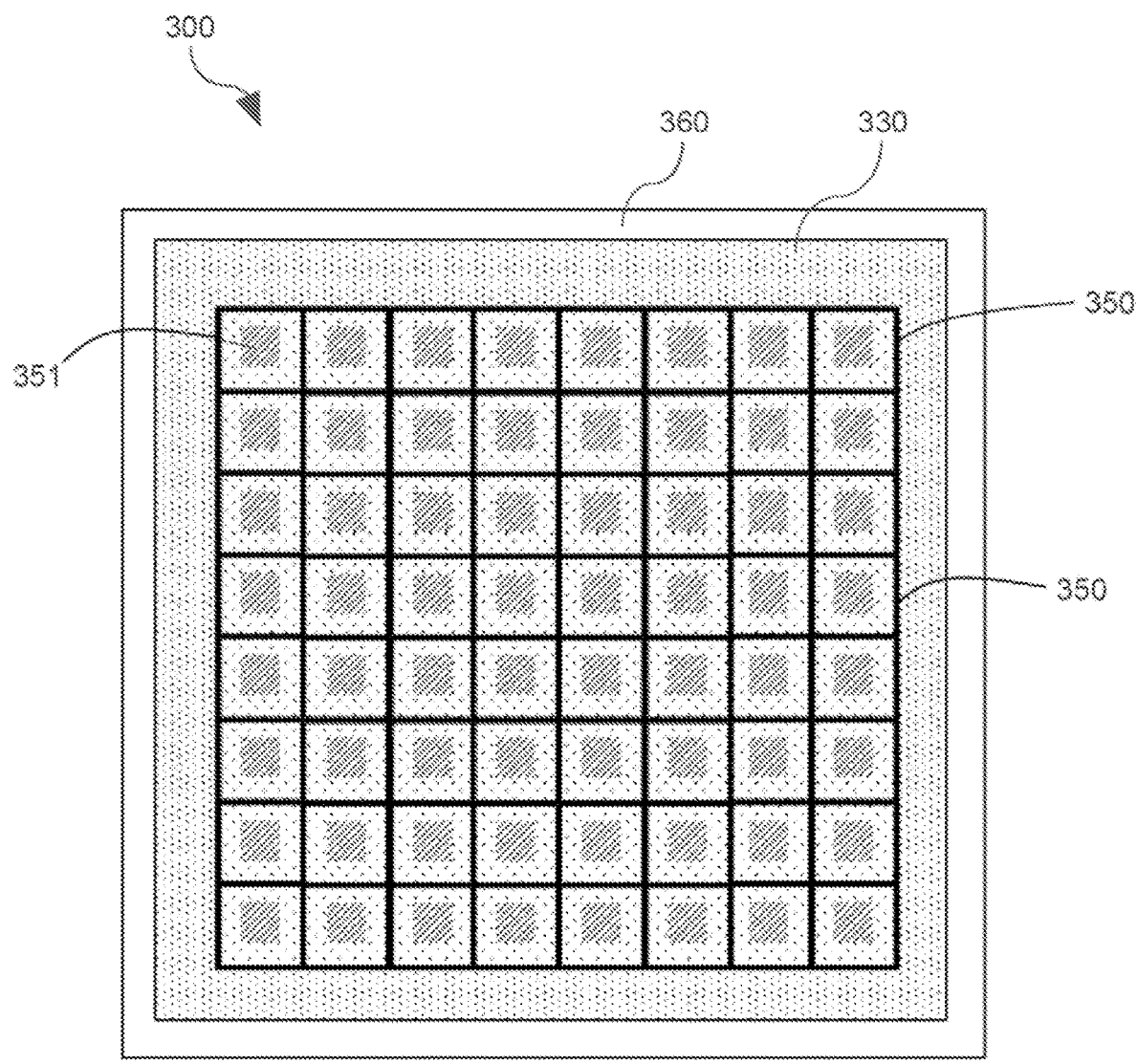
FIG. 6 is a top cross-section view of the assembly, as seen from the level indicated by the dot dash line A-A' in FIG. 5, depicting a bottom layer according to an embodiment of the present disclosure.
Figure 7:
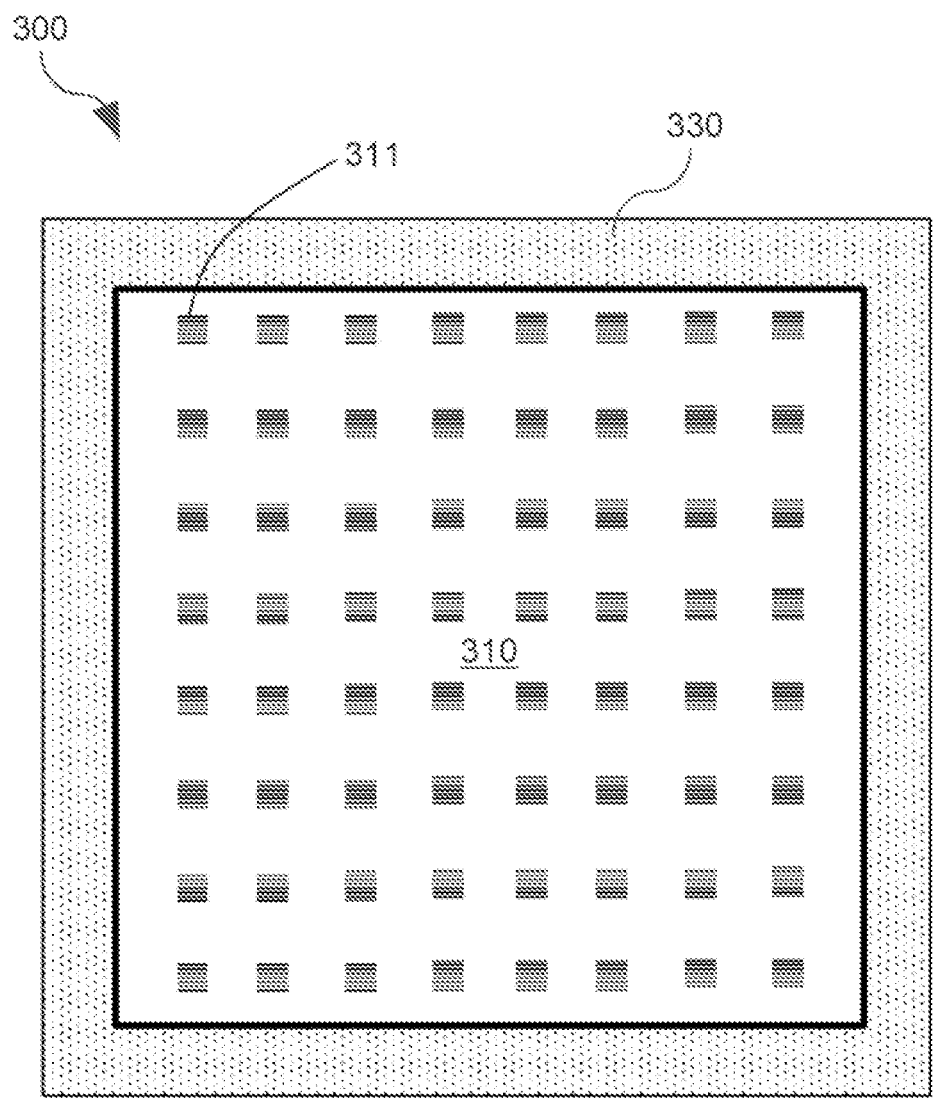
FIG. 7 is a top cross-section view of the assembly, as seen from the level indicated by the dot dash line B-B' in FIG. 5, depicting a top layer according to an embodiment of the present disclosure.

FIG. 5 is a side cross-section view of an assembly depicting an arrangement of AFEs and DSPs of SerDes according to another embodiment of the present disclosure. FIG. 6 is a top cross-section view of the assembly, as seen from the level indicated by the dot dash line A-A' in FIG. 5, depicting a bottom layer in this embodiment. FIG. 7 is a top cross-section view of the assembly, as seen from the level indicated by the dot dash line B-B' in FIG. 5, depicting a top layer in this embodiment. In the following, FIGS. 5 to 7 are described together to explain the working principle and inventive concept of this embodiment.

As shown in FIG. 5, 3D stacking is involved for an assembly 300 according to another embodiment of the present disclosure. In this embodiment, a digital-core die 310 is stacked atop a plurality of chiplets 350 distributed in a matrix, as shown in FIG. 6. The digital-core die 310 may be a single chip with a core IC (not shown) and a plurality of DSPs 311 embedded therein. The core IC is connected to the plurality of DSPs 311 through internal connections (not shown) for digitally processing signals received from the DSPs 311. Each of the chiplets 350 comprises at least one AFE 351 embedded therein. The at least one AFE 351 in one of the chiplets 350 may be aligned with the corresponding one of DSP 311 embedded in the digital-core die 310, as shown in FIGS. 5 to 7, to enable a short path between one of the AFEs 351 and the corresponding DSP 311.

A parallel digital interface 304 between the digital-core die 310 and the plurality of chiplets 350 may be in various suitable forms such as through-silicon vias (TSVs), interposers, and/or bonded metallization, for high-bandwidth digital data transmission. The required bandwidth depends on applications. For example, in high-speed optical communications, the data rate may range from several Gbps to 100 Gbps or higher, requiring a corresponding bandwidth. It will be appreciated that, although the parallel digital interface 304 in the example shown in FIG. 5 is in the form of microbumps, other forms of connections are readily available. TSVs may also be used in this example to electrically connect the bottom of the digital-core die 310 to the AFEs 351 that are at the bottom of the chiplets 350.

The stack including the digital-core die 310 and the plurality of chiplets 350 are fixed on an interposer 320, which is in turn fixed on a substrate 330. The interposer 320 is a thin layer of insulating material containing metal lines that serve as electrical interconnects between the matrix of the chiplets 350 and the substrate 330. The interposer 320 is also filled with metal conductors to make electrical connections between the matrix of the chiplets 350 and the substrate 330. The substrate 330 may be an organic or inorganic substrate that assists in routing signals into or out of the stack. In this embodiment, tertiary interconnects 303 are between the bottom of the plurality of chiplets 350 and the top of the interposer 320, and secondary interconnects 302 are between the bottom of the interposer 320 and the top of the substrate 330 in the form of flip-chip bonding, but it should be known that other forms of connections are readily available.

The stack including the digital-core die 310 and the plurality of chiplet 350, the interposer 320, and the substrate 230 are encapsulated into a package 340 as a standalone electronic device that may be further connected to a PCB 360 by a bonding method such as flip-chip bonding or SMT. In this embodiment, primary interconnects 301 are between the bottom of the substrate 330 and the top of the PCB 360 in the form of flip-chip bonding, but it should be known that other forms of connections are readily available. With the package mounted onto the PCB 360, routes are formed from the AFEs 351 in the chiplets 350 to a signaling channel (not shown) through the primary interconnects 301, the secondary interconnects 302, the tertiary interconnects 303, and traces (not shown) within the interposer 320, the substrate 330, and the PCB 360. The input/output (I/O) route is schematically denoted by dash lines in FIG. 5.

In case that the assembly 300 is used for a de-serialization process, it receives an input analog signal in a serial stream at a receiver of the AFE 351 from the signaling channel and converts the received analog signal into a digital signal by the receiver of the AFE 351. The de-serialization process takes place successively in one or more of the AFEs 351 and one or more of the DSPs 311. The analog-to-digital conversion may be done by an internal ADC module in the AFE 351, so the output of the AFE 351 for an input signal is in the digital domain. After the signal is transmitted to the DSPs 311 (embedded in the digital-core die 310) through the parallel digital interface 304, the DSPs 311 process the signal by finishing tasks such as clock and data recovery, signal equalization, error correction, and/or the like. Then, the processed digital signal is delivered to the core IC in the same digital-core die 310 through internal connections.

In case that the assembly 300 is used for a serialization process, it receives an output digital signal from the core IC in the same digital-core die 310 and process the received signal such as to pre-distort the signal to compensate for potential loss during data transmission in the analog domain. The serialization process takes place successively in one or more of the DSPs 311 and one or more of the AFEs 351. After the signal is transmitted to the AFEs 351 (embedded in the chiplets 350) through the parallel digital interface 303, the DAC in the AFE 351 converts the processed digital signal into analog signal. Then, the converted analog signal is transmitted in a serial stream to the signaling channel and eventually to an external electronic device that is either locally or remotely located in relation to the assembly 300.

In this embodiment, the AFEs 351 in the chiplets 350 and the DSPs 311 in the digital-core die 310 are physically separated and are connected through the parallel digital interface 304. The digital-core die 310 may typically be manufactured in a process with a technology-node geometry smaller than the technology-node geometry for the chiplets 350. Typically, the technology-node geometry for the digital-core die 310 may be 5 nm, 4 nm, 3 nm, or smaller, while the technology-node geometry for the chiplets may be 7 nm, 8 nm, or greater. This approach may avoid the AFEs and the DSPs being embedded within a same chip or chiplet and thus realize an advantageous arrangement of the AFEs and DSPs for SerDeses. As a result, the analog domain and the digital domain for a single SerDes are separated, with the AFEs taking advantage of an older, cheaper, less dense, yet more suitable technology for an analog domain and the DSPs taking advantage of a more advanced technology for digital processing. In addition, heat generated by the AFEs that typically deteriorates the performance of the DSPs is substantially isolated by the physical separation.

It will be appreciated that, although FIG. 5 shows that the digital-core die 310 is above the plurality of chiplets 350, the digital-core die may be placed beneath the plurality of chiplets 350 in some other embodiments. There may be additional layer(s) in the stack for additional function(s). Furthermore, although it is shown in FIGS. 5 to 7 that the AFEs 351 and the DSPs 311 are placed in the form of matrix in their respective layers, the AFEs 351 and the DSPs 311 may be placed in a different form.

Figure 8:
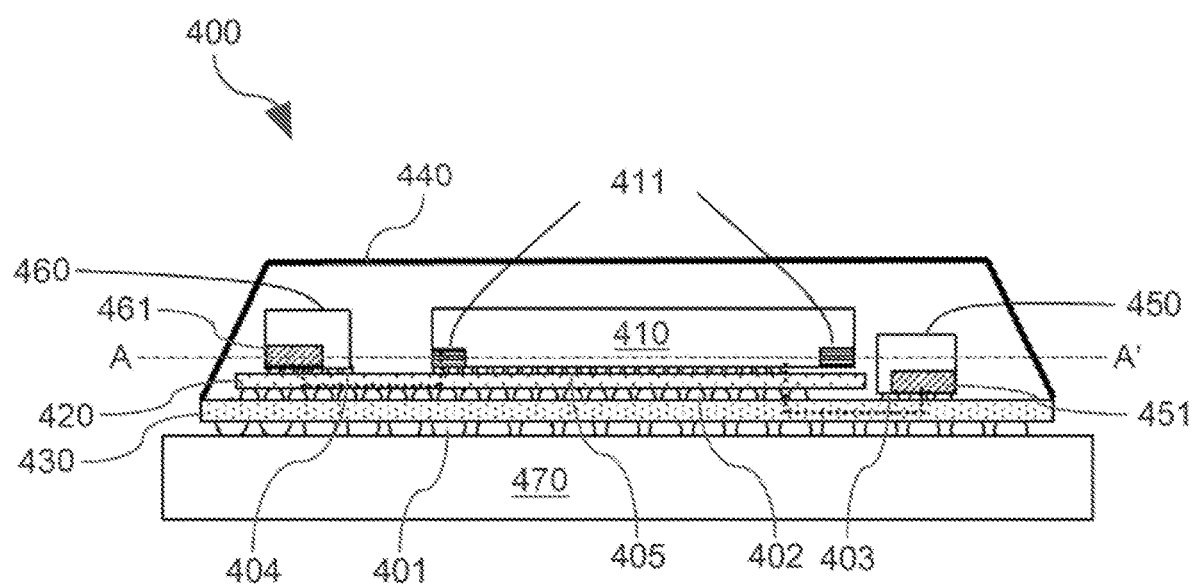
FIG. 8 is a side cross-section view of an assembly depicting an arrangement of AFEs and DSPs of SerDes according to an embodiment of the present disclosure.
Figure 9:
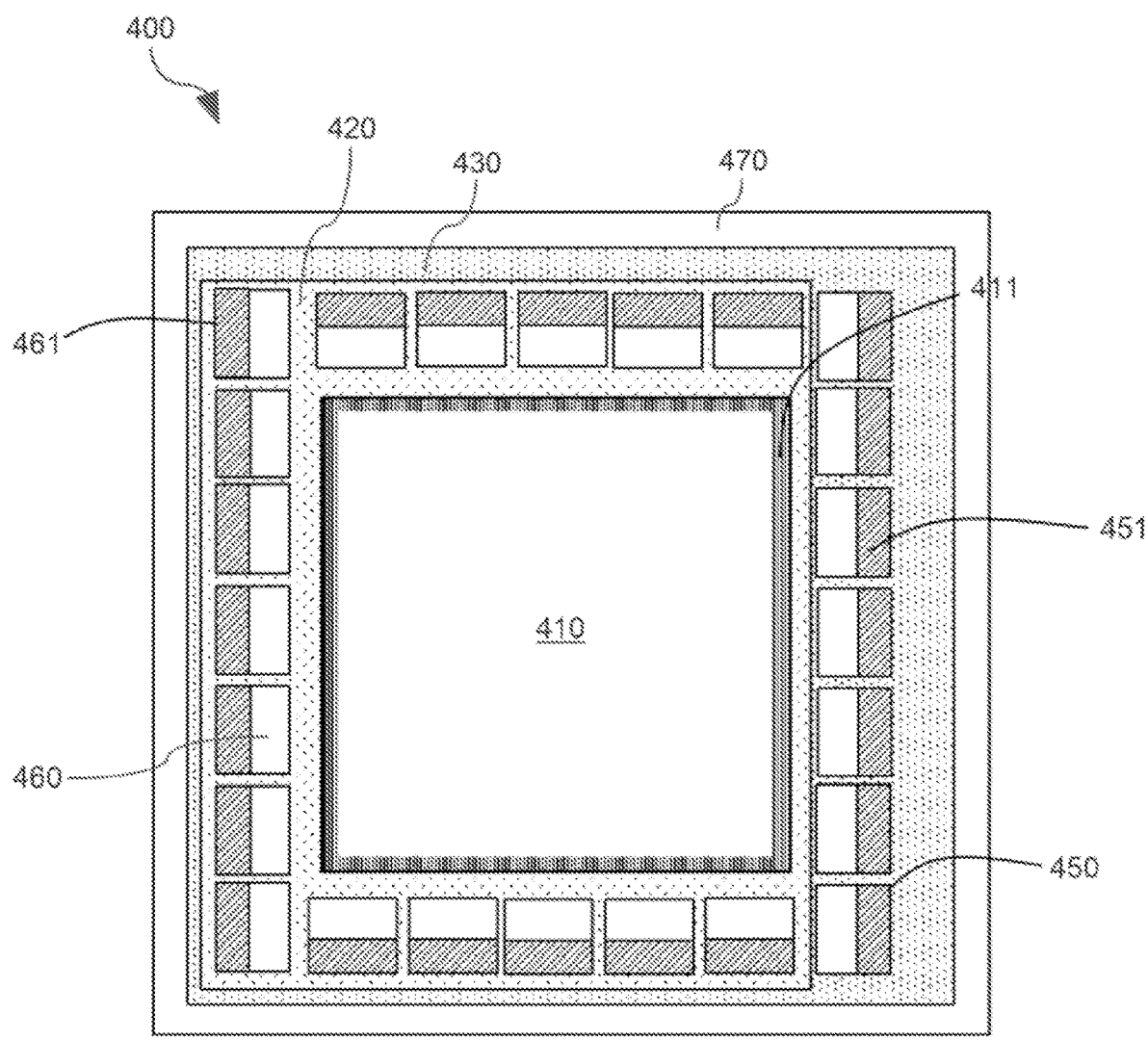
FIG. 9 is a top cross-section view of the assembly, as seen from the level indicated by the dot dash line A-A' in FIG. 8, according to an embodiment of the present disclosure.

FIG. 8 is a side cross-section view of an assembly depicting an arrangement of AFEs and DSPs of SerDes according to yet another embodiment of the present disclosure. FIG. 9 is a top cross-section view of the assembly, as seen from the level indicated by the dot dash line A-A' in FIG. 8, in this embodiment. In the following, FIGS. 8 and 9 are described together to explain the working principle and inventive concept of this embodiment.

As shown in FIG. 8, 2.5D stacking is involved for an assembly 400 according to yet another embodiment of the present disclosure. "2.5D stacking" refers to the stacking of semiconductor dies in a package, with the interconnections between the dies made through a system of microbumps and interposers, rather than traditional wire bonding. In this embodiment, a digital-core die 410 is surrounded by a plurality of primary chiplets 450 and a plurality of secondary chiplets 460, as shown in FIG. 9. The digital-core die 410 may be a single chip with a core IC (not shown) and a plurality of DSPs 411 embedded therein. The core IC is connected to the plurality of DSPs 411 through internal connections (not shown) for digitally processing signals received from the DSPs 411. Each of the primary chiplets 450 comprises at least one primary AFE 451 embedded therein, and each of the secondary chiplets 460 comprises at least one secondary AFE 461 embedded therein.

Interconnections between the digital-core die 410 and the primary chiplets 450 or the secondary chiplets 460 may be in various suitable forms for high-bandwidth digital data transmission. For example, as shown in FIG. 8, the digital-core die 410 and the secondary chiplets 460 are on an interposer 420, which includes traces allowing for the digital data transmission with a sufficiently high bandwidth between the DSPs 411 and the secondary AFEs 451. The interposer 420 and the primary chiplets 450 are on a substrate 430, which also includes traces allowing for the digital data transmission with a sufficiently high bandwidth between the DSPs 411 and the primary AFEs 461. It will be appreciated that, although microbumps are used in secondary interconnects 402 between the substrate 430 and the interposer 420, a primary parallel digital interface 403 between the primary chiplets 450 and the substrate 430, a secondary parallel digital interface 404 between the secondary chiplets 460 and the interposer 420, and a core parallel digital interface 405 between the digital-core die 410 and the interposer 420 in the example shown in FIG. 8, other forms of connections are readily available.

The substrate 430 may be an organic or inorganic substrate that assists in routing signals into or out of the primary AFEs 451 or the secondary AFEs 461. In this embodiment, the secondary interconnects 402 are between the bottom of the interposer 420 and the top of the substrate 430 in the form of flip-chip bonding, but it should be known that other forms of connections are readily available.

The digital-core die 410, the interposer 420, the primary chiplets 450, and the secondary chiplets 460 are encapsulated into a package 440 as a standalone electronic device that may be further connected to a PCB 470 by a bonding method such as flip-chip bonding or SMT. In this embodiment, primary interconnects 401 are between the bottom of the substrate 430 and the top of the PCB 470 in the form of flip-chip bonding, but it should be known that other forms of connections are readily available. With the package mounted onto the PCB 470, routes are formed from both the primary and secondary AFEs 451 and 461 in the primary and secondary chiplets 450 and 460 to a signaling channel (not shown) through the primary interconnects 401, the secondary interconnects 402, the primary parallel digital interface 403, the secondary parallel digital interface 404, and traces (not shown) within the interposer 420, the substrate 430, and the PCB 470.

In case that the assembly 400 is used for a de-serialization process, it receives an input analog signal in a serial stream at a receiver of at least one of the primary and secondary AFEs 451 and 461 from the signaling channel, and converts the received analog signal into a digital signal by the receiver. The de-serialization process takes place successively in one or more of the primary and secondary AFEs 451 and 461 and one or more of the DSPs 411. The analog-to-digital conversion may be done by internal ADC modules in the primary and secondary AFEs 451 and 461, so the output of the primary and secondary AFEs 451 and 461 for an input signal is in the digital domain. After the signal is transmitted to the DSPs 411 embedded in the digital-core die 410, the DSPs 411 process the signal by finishing tasks such as clock and data recovery, signal equalization, error correction, and/or the like. Then, the processed digital signal is delivered to the core IC in the same digital-core die 410 through internal connections.

In case that the assembly 400 is used for a serialization process, it receives an output digital signal from the core IC in the same digital-core die 410, and processes the received signal such as to pre-distort the signal to compensate for potential loss during data transmission in the analog domain. The serialization process takes place successively in one or more of the DSPs 411 and one or more of the primary and secondary AFEs 451 and 461. After the signal is transmitted to the primary and secondary AFEs 451 and 461 embedded in the primary and secondary chiplets 450, 460, the DACs in the primary and secondary AFEs 451 and 461 convert the processed digital signal into analog signal. Then, the converted analog signal is transmitted in a serial stream to the signaling channel and eventually to an external electronic device that is either locally or remotely located in relation to the assembly 400.

In this embodiment, the primary and secondary AFEs 451 and 461 (in the primary and secondary chiplets 450 and 460, respectively) and the DSPs 411 (in the digital-core die 410) are physically separated. The digital-core die 410 may typically be manufactured in a process with a technology-node geometry smaller than the technology-node geometry for the primary and secondary chiplets 450 and 460. Typically, the technology-node geometry for the digital-core die 410 may be 5 nm, 4 nm, 3 nm, or smaller, while the technology-node geometry for the chiplets 450 and 460 may be 7 nm, 8 nm, or greater. This approach may avoid the AFEs and the DSPs being embedded within a same chip or chiplet and thus realize an advantageous arrangement of the AFEs and DSPs for SerDeses. As a result, the analog domain and the digital domain for a single SerDes are separated, with the AFEs taking advantage of an older, cheaper, less dense, yet more suitable technology for an analog domain and the DSPs taking advantage of a more advanced technology for digital processing. In addition, heat generated by the AFEs that typically deteriorates the performance of the DSP is substantially isolated by the physical separation.

It will be appreciated that, although FIG. 8 shows that some of the chiplets are placed on the interposer with the digital-core die, while the other chiplets are placed on the substrate, all of the chiplets may be placed on the interposer in some other embodiments. Alternatively, all of the chiplets and the digital-core die may be placed on the substrate without the use of an interposer. There may be additional chip(s) or chiplet(s) placed or stacked for additional function(s).

Figure 10:
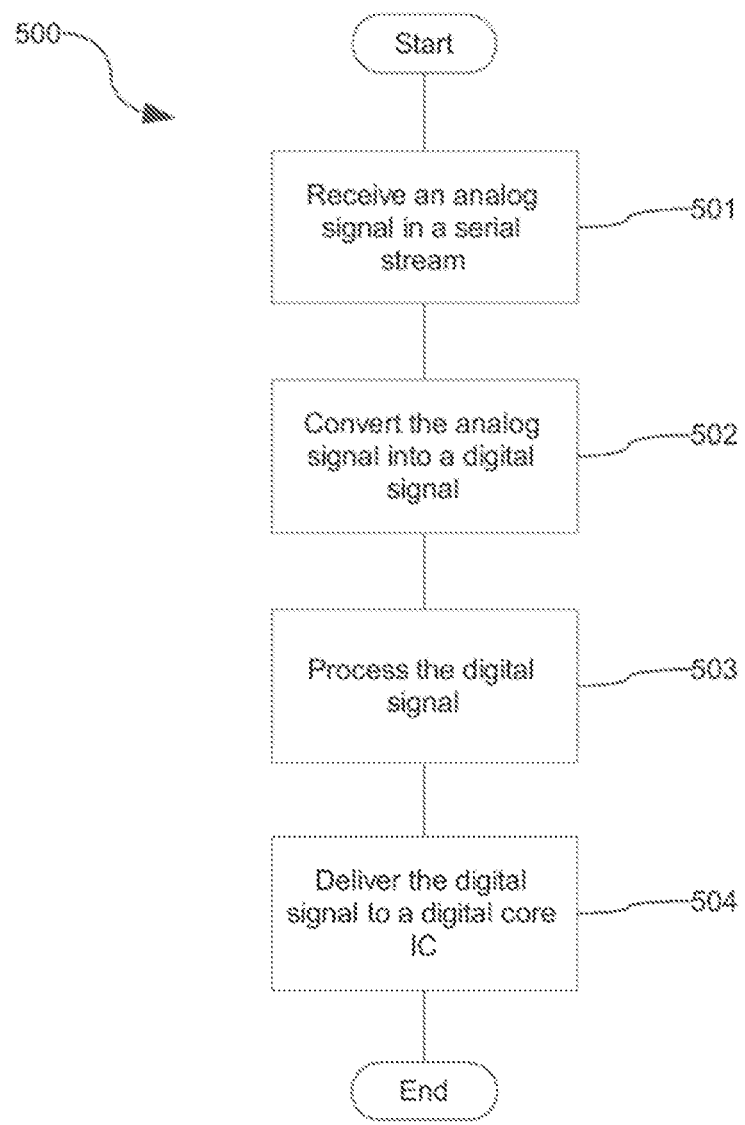
FIG. 10 is a flowchart depicting a de-serializing method according to an embodiment of the present disclosure.

FIG. 10 is a flowchart depicting a de-serializing method 500 according to an embodiment of the present disclosure. The de-serializing method 500 may be carried out in one or more of the AFEs and one or more of the DSPs according to embodiments presented herein. The de-serializing method 500 starts with a step 501 of receiving, by a receiver of an AFE, an analog signal in a serial stream from a signaling channel. Then, at step 502, the method 500 includes a process of converting, by the receiver, the received analog signal into a digital signal. At step 503, the method 500 includes a process of processing, by a DSP connected to the AFE through a parallel digital interface, the converted digital signal from the receiver of the AFE. At last, the method 500 ends with a step 504 of delivering, by the DSP, the processed digital signal to a digital-core IC. For the de-serializing method 500 according to the present disclosure, the DSP and the digital-core IC are embedded in a digital-core die and the AFE is embedded in a chiplet that is separated from the digital-core die.

Figure 11:
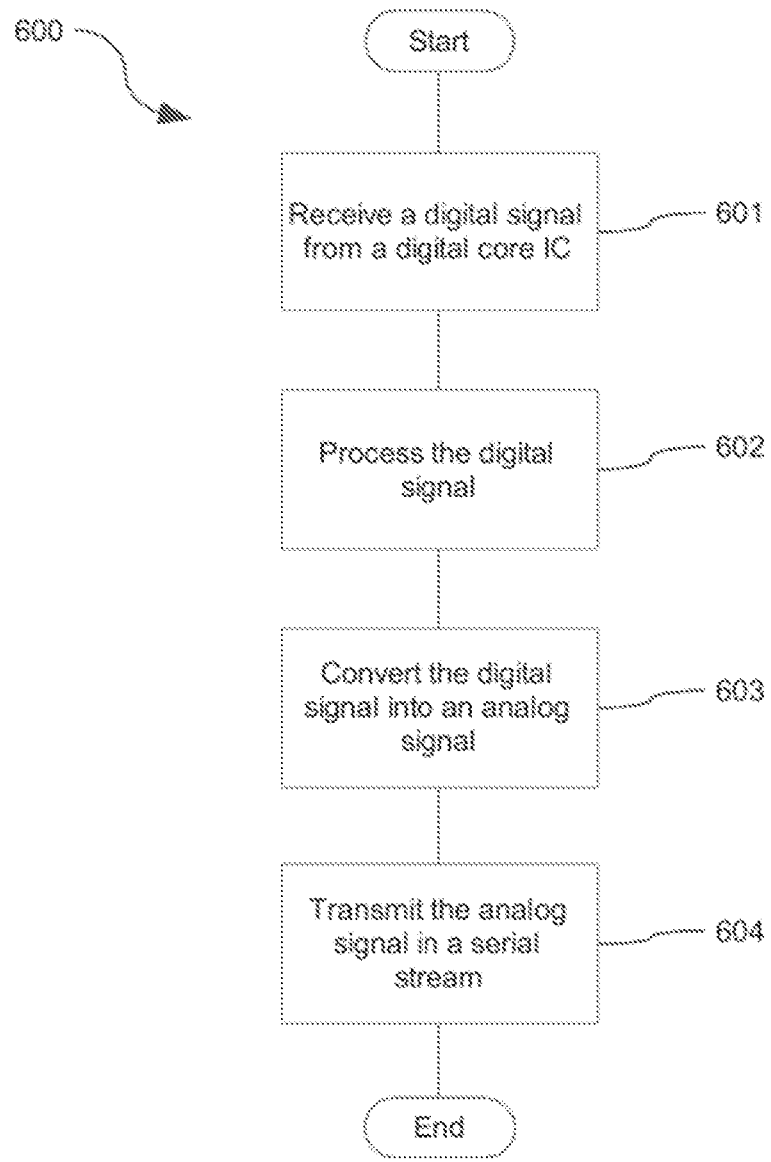
FIG. 11 is a flowchart depicting a serializing method according to an embodiment of the present disclosure.

FIG. 11 is a flowchart depicting a serializing method 600 according to an embodiment of the present disclosure. The serializing method 600 may be carried out in one or more of the DSPs and one or more of the AFEs according to embodiments presented herein. The serializing method 600 starts with a step 601 of receiving, by a DSP, a digital signal from a digital-core IC. Then, at step 602, the method 600 includes a process of processing, by the DSP, the received digital signal. At step 603, the method 600 includes a process of converting, by a transmitter of an AFE connected to the DSP through a parallel digital interface, the processed digital signal into an analog signal. At last, the method 600 ends with a step 604 of transmitting, by the transmitter, the converted analog signal in a serial stream to a signaling channel. For the serializing method 600 according to the present disclosure, the DSP and the digital-core IC are embedded in a digital-core die and the AFE is embedded in a chiplet that is separated from the digital-core die.

It will be appreciated by one of ordinary skill in the art that the modules, systems and components shown in FIGS. 1-11 may include components not shown in the drawings. For simplicity and clarity of the illustration, elements in the figures are not necessarily to scale, are only schematic and are non-limiting of the elements structures. It will be apparent to persons skilled in the art that a number of variations and modifications may be made without departing from the scope of the present description.

Numerous additional variations on the methods and apparatus of the various embodiments described above will be apparent to those skilled in the art in view of the above description. Such variations are to be considered within the scope.

What is claimed is:

1. A de-serializing method, comprising:
receiving, by a receiver of an analog front end (AFE), an analog signal in a serial stream from a signaling channel;
converting, by the receiver, the received analog signal into a digital signal;
processing, by a digital signal processor (DSP) connected to the AFE through a parallel digital interface, the converted digital signal from the receiver of the AFE; and
delivering, by the DSP, the processed digital signal to a digital-core integrated circuit (IC),
wherein the DSP and the digital-core IC are embedded in a digital-core die and the AFE is embedded in a chiplet that is separated from the digital-core die, wherein the digital-core die and the chiplet are stacked with each other, wherein the DSP in the digital-core die is aligned with the AFE in the chiplet, wherein the parallel digital interface between the DSP and the AFE is in a form of through silicon vias (TSVs), bonded metallization, or a combination thereof, and wherein the de-serializing method is carried out in the AFE and the DSP successively.

2. The de-serializing method according to claim 1, wherein the digital-core die is manufactured in a process with a technology-node geometry smaller than the technology-node geometry for the chiplet.

3. The de-serializing method according to claim 1, wherein the AFE and the DSP form a serializer-de-serializer (SerDes).

4. A serializing method comprising:
receiving, by a digital signal processor (DSP), a digital signal from a digital-core integrated circuit (IC);
processing, by the DSP, the received digital signal;
converting, by a transmitter of an analog front end (AFE) connected to the DSP through a parallel digital interface, the processed digital signal into an analog signal; and
transmitting, by the transmitter, the converted analog signal in a serial stream to a signaling channel,
wherein the DSP and the digital-core IC are embedded in a digital-core die and the AFE is embedded in a chiplet that is separated from the digital-core die, wherein the digital-core die and the chiplet are stacked with each other, wherein the DSP in the digital-core die is aligned with the AFE in the chiplet, wherein the parallel digital interface between the DSP and the AFE is in a form of through silicon vias (TSVs), bonded metallization, or a combination thereof, and wherein the serializing method is carried out in the DSP and the AFE successively.

5. The de-serializing method according to claim 4, wherein the digital-core die is manufactured in a process with a technology-node geometry smaller than the technology-node geometry for the chiplet.

6. The de-serializing method according to claim 4, wherein the AFE and the DSP form a serializer-de-serializer (SerDes).

7. A module, comprising:
an analog front end (AFE) comprising a receiver, for receiving an input analog signal in a serial stream from a signaling channel and converting the input analog signal into an input digital signal, and a transmitter for converting an output digital signal into an output analog signal and transmitting the output analog signal in a serial stream to the signaling channel; and
a digital signal processor (DSP) connected to the AFE through a parallel digital interface for processing the input digital signal from the receiver of the AFE and delivering the processed input digital signal to a digital-core integrated circuit (IC) or for processing the output digital signal from the digital-core IC and delivering the processed output digital signal to the transmitter of the AFE,
wherein the DSP and the digital-core IC are embedded in a digital-core die and the AFE is embedded in a chiplet that is separated from the digital-core die, wherein the digital-core die and the chiplet are stacked with each other, wherein the DSP in the digital-core die is aligned with the AFE in the chiplet, and wherein the parallel digital interface between the DSP and the AFE is in a form of through silicon vias (TSVs), bonded metallization, or a combination thereof.

8. The module according to claim 7, wherein the digital-core die is manufactured in a process with a technology-node geometry smaller than the technology-node geometry for the chiplet.

9. The module according to claim 7, wherein the module is a serializer-de-serializer (SerDes).

10. A system, comprising:
a plurality of chiplets;
a digital-core die that is separated from the plurality of chiplets; and
a plurality of modules, each comprising:
an analog front end (AFE) comprising a receiver, for receiving an input analog signal in a serial stream from a signaling channel and converting the input analog signal into an input digital signal, and a transmitter for converting an output digital signal into an output analog signal and transmitting the output analog signal in a serial stream to the signaling channel, the AFE being embedded in one of the plurality of chiplets; and
a digital signal processor (DSP) connected to the AFE through a parallel digital interface for processing the input digital signal from the receiver of the AFE and delivering the processed input digital signal to a digital-core integrated circuit (IC) or for processing the output digital signal from the digital-core IC and delivering the processed output digital signal to the transmitter of the AFE, the DSP and the digital-core IC being embedded in the digital-core die,
wherein the digital-core die and the plurality of chiplets are stacked with each other, wherein, for each of the plurality of modules, the DSP in the digital-core die is aligned with the AFE in one of the plurality chiplets, and wherein, for each of the plurality of modules, the parallel digital interface between the DSP and the AFE is in a form of through silicon vias (TSVs), bonded metallization, or a combination thereof.

11. The system according to claim 10, wherein the digital-core die is manufactured in a process with a technology-node geometry smaller than the technology-node geometry for the chiplet.

12. The system according to claim 10, wherein each of the plurality of chiplets comprises a plurality of AFEs.

13. The system according to claim 10, wherein each of the plurality of modules is a serializer-de-serializer (SerDes) and the digital-core IC is a digital processing unit including one of application specific integrated circuit (ASIC), field programmable gate array (FPGA), central processing unit (CPU), network processing unit (NPU), graphic processing unit (GPU), tensor processing unit (TPU), or switch fabric unit (SFU).

14. The system according to claim 10,
wherein the system further comprises a second die, the plurality of chiplets being arranged to surround the second die, and
wherein the digital-core die is stacked atop both the second die and the plurality of chiplets.

15. The system according to claim 10,
wherein the plurality of chiplets are arranged in a form of matrix, and
wherein the digital-core die is stacked atop the plurality of chiplets.

16. The system according to claim 15, further comprising a printed circuit board (PCB) and an interposer on the PCB, the interposer enabling the serial stream to be routed from the AFE to the signaling channel or from the signaling channel to the AFE through the PCB.

17. The system according to claim 10, wherein the plurality of chiplets are arranged to surround the digital-core die.

18. The system according to claim 17, further comprising a PCB and an interposer on the PCB, the interposer enabling the parallel digital interface to be routed between the AFE in the at least one of the plurality of chiplets and a corresponding DSP in the digital-core die.

* * * * *